United States Patent [19]

Ishikawa

[11] Patent Number: 4,818,874
[45] Date of Patent: Apr. 4, 1989

[54] SCANNING ELECTRON MICROSCOPE
[75] Inventor: Toyoji Ishikawa, Tokyo, Japan
[73] Assignee: JEOL Ltd., Tokyo, Japan
[21] Appl. No.: 181,201
[22] Filed: Apr. 13, 1988
[30] Foreign Application Priority Data
  Apr. 17, 1987 [JP] Japan ............ 62-58351[U]
[51] Int. Cl.[4] .................. H01J 37/256; H01J 37/244
[52] U.S. Cl. .................................... 250/310; 250/397
[58] Field of Search ............ 250/440.1, 442.1, 306, 250/310, 397, 398, 399, 400

[56] References Cited

U.S. PATENT DOCUMENTS 4,426,577  1/1984  Kokie et al. ............... 250/310
4,437,009  3/1984  Yamazaki ................ 250/396 ML

FOREIGN PATENT DOCUMENTS 0003358  1/1982  Japan .................... 250/310
35854    of 1983  Japan .
165357   of 1984  Japan .
0263035  11/1986  Japan .................... 250/310

Primary Examiner—Jack I. Berman
Attorney, Agent, or Firm—Webb, Burden, Ziesenheim & Webb

[57] ABSTRACT

There is disclosed an electron microscope comprising a stage assembly for tilting, translating, or rotating the specimen, a first and a second detector disposed on opposite sides of the optical axis of the beam to detect secondary electrons produced in response to the incidence of the beam. The first detector is disposed relatively close to the optical axis. The second detector is located relatively remotely from the optical axis to prevent the state assembly from colliding against the detector when the assembly is tilted. The gains of the amplifiers to which the outputs of the first and second detectors are applied are made different to compensate for the imbalance between the intensities of the output signals from the detectors.

3 Claims, 1 Drawing Sheet

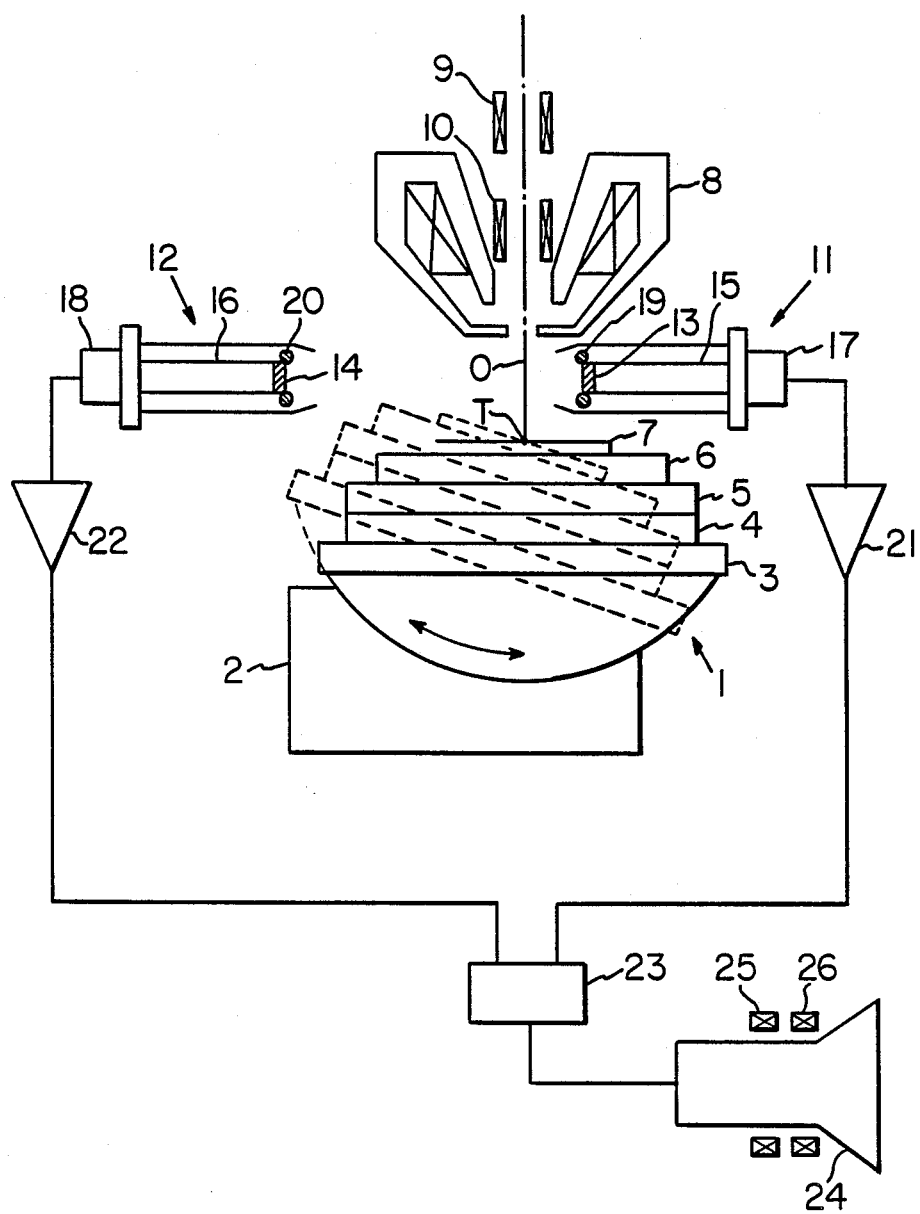

SCANNING ELECTRON MICROSCOPE

FIELD OF THE INVENTION

The present invention relates to a scanning electron microscope and, more particularly, to improvements in a scanning electron microscope equipped with a plurality of detectors for detecting secondary electrons.

BACKGROUND OF THE INVENTION

In a scanning electron microscope, a desired region on a specimen is scanned with an electron beam. The irradiation of the beam produces secondary electrons, which are detected by a detector. The output signal from the detector is supplied as an intensity-modulating signal to a cathode-ray tube which is synchronized with the scan of the electron beam on the specimen. Thus, an image produced from the secondary electrons emanating from the specimen is displayed on the cathode-ray tube.

Usually, such a secondary electron detector comprises a scintillator that produces light in response to incidence of secondary electrons, a photomultiplier, and a light-pipe for guiding light from the scintillator to the photomultiplier. An electron collection electrode to which a high positive voltage is applied is disposed close to the scintillator so that the secondary electrons may efficiently enter the scintillator. This detector is located off the optical axis in the space between the objective lens and the specimen.

Specimens have topographical surface irregularities. Therefore, a specimen surface has portions facing a secondary electron detector. The remaining portions form shade portions as viewed from the detector. Secondary electrons emanating from the facing surface portions are collected to the detector efficiently. As for secondary electrons emitted from the shade portions, however, only some of them can reach the detector. As a result, those portions of the image created on a cathode-ray tube which correspond to surface portions facing the detector appear especially bright, whereas the portions corresponding to shade portions look especially dark. Hence, the resulting contrast is undesirable.

Japanese Patent Unexamined Laid-Open No. 35854/1983 discloses a pair of secondary electron detectors arranged symmetrically with respect to the optical axis of an electron beam. The output signals from the detectors are added to prevent the occurrence of an undesirable contrast as mentioned above.

Japanese Patent Unexamined Laid-Open No. 165357/1984 discloses a technique in which a pair of secondary electron detectors is arranged symmetrically with respect to the optical axis of an electron beam, and in which the ratio of the output signal from one detector to the output signal from the other is taken. Signals are applied to a cathode-ray tube at this ratio to emphasize the surface geometry of a specimen.

In any of the aforementioned prior art techniques, a pair of secondary electron detectors is disposed. Preferably, the detectors are disposed as close as possible to the region of a specimen irradiated with an electron beam, because such arrangement enhances the efficiency of detection. It is necessary that the detectors be located so as not to impede tilt of the specimen.

SUMMARY OF THE INVENTION

It is an object of the present invention to provide an improved scanning electron microscope equipped with a pair of detectors capable of detecting secondary electrons efficiently.

It is another object of the invention to provide a scanning electron microscope which is equipped with a pair of secondary electron detectors and which permits a specimen to be tilted at a large angle.

A scanning electron microscope according to the invention comprises: a means for directing an electron beam onto a specimen; a means for scanning a desired region on the specimen with the electron beam; a stage assembly for tilting, translating, or rotating the specimen; a first and a second detector for detecting secondary electrons emanating from the specimen in response to the incidence of the electron beam, the detectors being disposed on opposite sides of the optical axis of the electron beam, the first detector being disposed relatively close to the optical axis of the beam, the second detector being disposed relatively remotely from the optical axis to prevent the state assembly from colliding against the second detector when the stage assembly is tilted; a first and a second amplifier for amplifying the output signals from the first and second detectors, respectively, the amplifiers having different gains for compensating for the imbalance between the intensities of the output signals from the detectors; an arithmetic circuit that arithmetically processes the output signals from the amplifiers; and a cathode-ray tube to which the output signal from the arithmetic circuit is supplied as an intensity-modulating signal.

BRIEF DESCRIPTION OF THE DRAWING

The FIGURE is a diagram of a scanning electron microscope according to the invention.

DESCRIPTION OF THE PREFERRED EMBODIMENT

Referring to the FIGURE, a scanning electron microscope embodying the concept of the present invention includes a stage assembly 1 that is composed of a tiltable member 3 supported on a support member 2, an X carriage 4, Y carriage 5, and a rotating member 6. A specimen 7 is placed on the rotating member 6. The upper surface of the support member 2 is curved. The lower surface of the tilt member 3 is so curved that it is in intimate contact with the upper surface of the support member 2. The tilt member 3 can be tilted about an axis T in the direction indicated by the arrow by a drive mechanism (not shown). This axis T intersects with the optical axis O of the electron beam and also with the specimen surface. The X carriage 4 is mounted on the tilt member 3 so as to be slidable. The X carriage 4 can be moved along the X axis by a drive mechanism (not shown). The Y carriage 5 is so mounted on the X carriage 4 that it can slide on the carriage 4. The Y carriage 5 can be shifted along the Y axis by a drive mechanism (not shown). The rotating member 6 is rotatably mounted on the Y carriage 5, and is rotated by a rotating mechanism (not shown).

An electron beam is produced by an electron gun (not shown) and accelerated. Then, the beam is focused onto the specimen 7 by an objective lens 8. The point on the specimen 7 which is irradiated with the beam is moved by supplying scanning signals to deflector coils 9 and 10. Thus, a desired region on the specimen is scanned with the electron beam.

A pair of secondary electron detectors, 11 and 12, is disposed in the space between the objective lens 8 and the specimen 7. The detector comprises a scintillator 13 that emits light in response to incidence of secondary electrons, a light-pipe 15, a photomultiplier 17, and an annular collector electrode 19. Similarly, the detector 12 comprises a scintillator 14, a light-pipe 16, a photomultiplier 18, and an annular collector electrode 20. A high positive voltage is applied to the electrodes 19 and 20 from a power supply (not shown) to produce an electric field which acts on the surface of the specimen 7. Secondary electrons emanating from the specimen 7 are attracted by the electric field towards the scintillators 13 and 14 and hit them.

The secondary electrons falling on the scintillators 13 and 14 are converted to light which is then transmitted by the light-pipes 15 and 16 to the photomultipliers 17 and 18, where it is transformed into electrical signals. The electrical signals from the photomultipliers 17 and 18 are fed to amplifiers 21 and 22, respectively. The output signals from the amplifiers 21 and 22 are fed to an adder circuit 23, where they are summed. The sum signal from the adder circuit 23 is supplied as an intensity-modulating signal to a cathode-ray tube 24 having deflecting coils 25 and 26. Scanning signals which are fed to the deflector coils 9 and 10 are also supplied to the deflecting coils 25 and 26. Consequently, an image of the specimen is formed on the CRT 24, based on the secondary electrons emitted by the specimen 7.

In the structure described above, one detector 11 of the two detectors is disposed close to the optical axis O to exert a strong electric field on the irradiated region of the specimen 7, for efficiently detecting secondary electrons. The other detector 12 is located remotely from the optical axis O to prevent the tilt member 3 from colliding against the detector 12 when the tilt member 3 is tilted and the stage assembly 1 assumes the position indicated by the broken lines. The specimen has topographical surface irregularities. Most of the secondary electrons produced from the surface portions facing the detector 11 are detected by the detector 11. Most of the secondary electrons emitted from the surface portions which face away from the detector 11 but face on the detector 12 are detected by the detector 12. Since the detector 12 is situated remotely from the optical axis O, or the point on the specimen irradiated with the electron beam, the intensity of the electric field set up by the collector electrode 20 is relatively low near the irradiated point. Consequently, those secondary electrons which travel toward the detector 12 are detected with less efficiency.

The output signal from the detector 11 is larger in intensity than the output signal from the detector 12, for the reason described above. The imbalance between these output signals is compensated by the amplifiers 21 and 22. Specifically, the gain of the amplifier 22 is set larger than that of the amplifier 21, in order that the intensity of the signal produced by detecting the secondary electrons emanating from the specimen surface portions facing the detector 11 be substantially equal to the intensity of the signal produced by detecting the secondary electrons emitted from surface portions facing the detector 12.

The adder circuit 23 produces the sum of the output signals from the amplifiers 21 and 22, and the sum signal is supplied to the CRT 24 as an intensity modulating signal. Therefore, the image formed on the CRT 24 has uniform contrast. Thus, it is unlikely that the image is made locally bright or dark due to the topographical irregularities on the specimen surface.

In the above example, the output signals from two amplifiers are added up. It is also possible to calculate the ratio of the intensity of one output signal to the intensity of the other output signal and to supply signals to the CRT at the calculated ratio. In this case, the image formed on the CRT emphasized the geometry of the specimen surface.

Having thus described my invention with the detail and particularity required by the Patent Laws, what is desired and claimed protected by Letters Patent is set forth in the following claims.

What is claimed is:

1. A scanning electron microscope in which secondary electrons from the specimen surface are detected and in which the topography of the specimen does not produce undesired contrasts comprising:
    a means for focusing an electron beam onto a specimen including an objective lens;
    a means for scanning a desired region on the specimen with the electron beam;
    a stage assembly for tilting, translating, or rotating the specimen;
    a first and a second detector for detecting secondary electrons emanating from the specimen in response to the incidence of the electron beam, the detector being disposed both on the same side of the objective lens nearest the stage assembly and each on opposite sides of the optical axis of the electron beam, the first detector being disposed relatively close to the optical axis of the beam, the second detector being disposed relatively remotely from the optical axis such that the stage assembly does not collide with the secondary detector when the stage assembly is tilted through its normal range of motion;
    a first and a second amplifier for amplifying the output signals from the first and second detectors, respectively, the amplifiers each having means for adjusting the gain for compensating for the imbalance between the intensities of the output signals from the detectors such that the undesired contrasts caused by specimen topography are reduced;
    an arithmetic circuit that arithmetically processes the output signals from the amplifiers; and
    a cathode-ray tube to which the output signal from the arithmetic circuit is supplied as an intensity-modulating signal.

2. The scanning electron microscope of claim 1, wherein said arithmetic circuit adds up the output signals from the first and second amplifiers.

3. The scanning electron microscope of claim 1, wherein said arithmetic circuit calculates the ratio between the output signals from the first and second amplifiers.

* * * * *

UNITED STATES PATENT AND TRADEMARK OFFICE
CERTIFICATE OF CORRECTION

PATENT NO. : 4,818,874

DATED : April 4, 1989

INVENTOR(S) : Toyoji Ishikawa

It is certified that error appears in the above-identified patent and that said Letters Patent is hereby corrected as shown below:

Column 1 Line 46 "With" should read --with--.

Column 3 Line 1 after "detector" insert --11--.

Claim 1 Column 4 Line 32 "detector" should read --detectors--.

Signed and Sealed this

Thirty-first Day of October, 1989

Attest:

DONALD J. QUIGG

Attesting Officer

Commissioner of Patents and Trademarks